US008941123B2

(12) United States Patent
Cohen et al.

(10) Patent No.: US 8,941,123 B2
(45) Date of Patent: Jan. 27, 2015

(54) LOCAL INTERCONNECTS BY METAL-III-V ALLOY WIRING IN SEMI-INSULATING III-V SUBSTRATES

(71) Applicant: International Business Machines Corporation, Armonk, NY (US)

(72) Inventors: Guy Cohen, Mohegan Lake, NY (US); Cyril Cabral, Jr., Mahopac, NY (US); Anirban Basu, Jr., Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/905,894

(22) Filed: May 30, 2013

(65) Prior Publication Data

US 2014/0353751 A1    Dec. 4, 2014

(51) Int. Cl.
H01L 29/22 (2006.01)
H01L 29/43 (2006.01)
H01L 29/45 (2006.01)
H01L 21/24 (2006.01)
H01L 21/768 (2006.01)
H01L 23/50 (2006.01)

(52) U.S. Cl.
CPC ......... *H01L 21/76895* (2013.01); *H01L 23/50* (2013.01)
USPC ............. 257/78; 257/615; 257/744; 257/768; 257/769; 257/770; 257/E29.113; 257/E29.139; 257/E29.096

(58) Field of Classification Search
None
See application file for complete search history.

(56) References Cited

U.S. PATENT DOCUMENTS

| 4,033,788 | A | * | 7/1977 | Hunsperger et al. | 438/167 |
|---|---|---|---|---|---|
| H291 | H | * | 6/1987 | Boos | 257/279 |
| H000291 | H | * | 6/1987 | Boos | 257/279 |
| 4,738,934 | A | * | 4/1988 | Johnston et al. | 438/508 |
| 4,818,721 | A | * | 4/1989 | Wang | 438/91 |
| 5,179,041 | A | | 1/1993 | Yano et al. | |
| 5,192,700 | A | * | 3/1993 | Shimura | 438/174 |
| 5,254,483 | A | | 10/1993 | Forgerson et al. | |
| 5,429,963 | A | * | 7/1995 | Martinez et al. | 438/169 |
| 6,555,890 | B2 | * | 4/2003 | Dries et al. | 257/458 |
| 2009/0194846 | A1 | | 8/2009 | Chang et al. | |

(Continued)

FOREIGN PATENT DOCUMENTS

| CN | 101783367 A | 7/2010 |
|---|---|---|
| CN | 102496567 | 6/2012 |

(Continued)

OTHER PUBLICATIONS

Lu, Y., et. al., "Rapid Thermal Alloyed Ohmic Contacts to p-Type GaAs", J. Electrochem. Soc. vol. 136, No. 10 (1989) pp. 3123-3129.*

(Continued)

*Primary Examiner* — Thomas L Dickey
*Assistant Examiner* — Joseph Schoenholtz
(74) *Attorney, Agent, or Firm* — Louis J. Percello, Esq.; McGinn IP Law Group, PLLC

(57) ABSTRACT

A structure and method of producing a semiconductor structure including a semi-insulating semiconductor layer, a plurality of isolated devices formed over the semi-insulating semiconductor layer, and a metal-semiconductor alloy region formed in the semi-insulating semiconductor layer, where the metal-semiconductor alloy region electrically connects two or more of the isolated devices.

18 Claims, 4 Drawing Sheets

(56) References Cited

U.S. PATENT DOCUMENTS

2013/0075906 A1   3/2013  Matsuda
2013/0119486 A1*  5/2013  Kaibara et al. ................ 257/411
2013/0341721 A1* 12/2013  Aoki et al. .................... 257/347

FOREIGN PATENT DOCUMENTS

CN      101783367 B    10/2012
KR      100247440       3/2000

OTHER PUBLICATIONS

Kazlauskiene, V., et. al., "Formation of Ohmic Contacts on Semi-Insulating GaAs by Laser Deposition of In", Semiconductors, vol. 38, No. 1, pp. 78-91 (2004).*

Yokoyama, M., et. al., "Self-aligned Ni-GaSb source/drain junctions for GaSb p-channel metal-oxidesemiconductor", Appl. Phys. Lett., 104, 093509 (2014).*

Kim, S., et. al., Self-Aligned Metal Source/Drain InGaAs N-Metal-Oxide-Semiconductor Field-Effect Transistors Using Ni-InGaAs Alloy. Applied Physics Express 4.2 (2011): 024201.*

Baca, A.G., "A survey of ohmic contacts to III-V compound semiconductors", Thin Solid Films 308-309 (1997) pp. 599-606.*

Definition of 'alloy' downloaded from URL<http://www.merriam-webster.com/dictionary/alloy> on May 15, 2014.*

Self-aligned Metal S/D InP MOSFETs using Metallic Ni-InP alloys, 23rd International Conference on Indium Phosphide and Related Materials—IPRM 2011, May 22-26, 2011, Berlin, Germany.

* cited by examiner

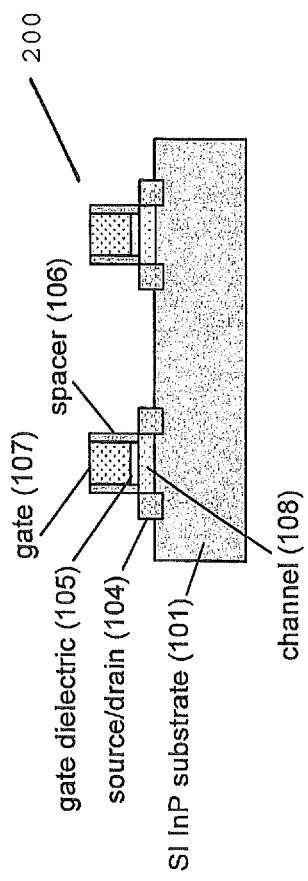
Fig. 4
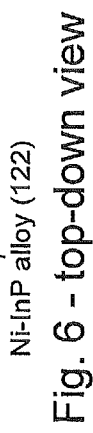
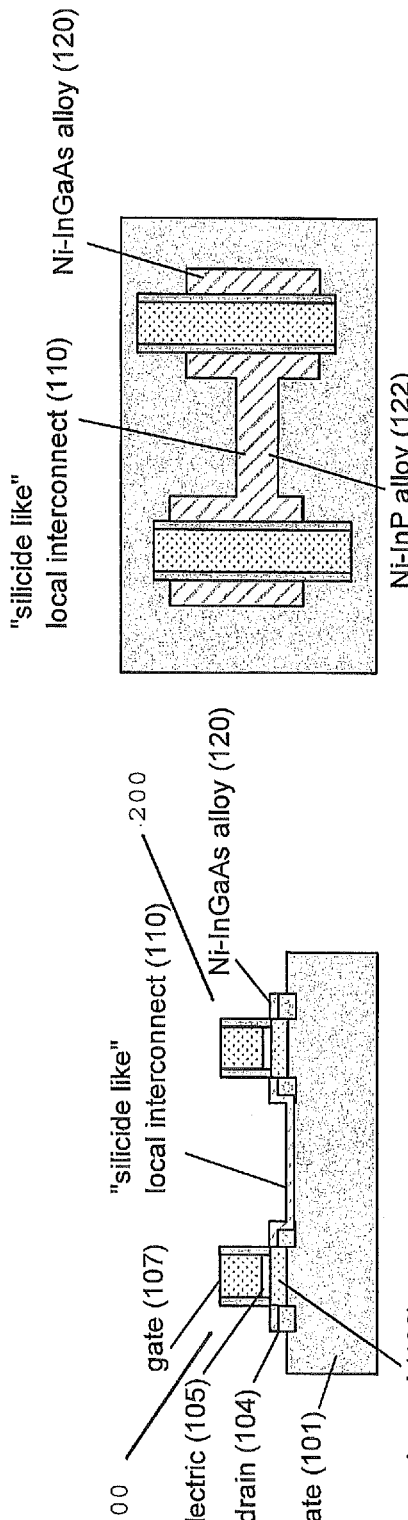
Fig. 5
Fig. 6 - top-down view

LOCAL INTERCONNECTS BY METAL-III-V ALLOY WIRING IN SEMI-INSULATING III-V SUBSTRATES

BACKGROUND OF THE INVENTION

1. Field of the Invention

The present invention relates generally to a semi-insulating semiconductor layer having components formed thereon connected by a metal-semiconductor alloy.

2. Description of the Related Art

Devices fabricated using silicon on insulator (SOI) technology are isolated using a shallow trench isolation (STI) process or simply by etching the SOI film that would otherwise connect two active regions of separate devices. The device isolation (e.g. for planar or Fin Field-Effect Transistors (FETs)) is obtained by etching the SOI film down to the buried oxide (BOX). The BOX, however, consists of silicon dioxide ($SiO_2$) which is an insulator, and cannot be transformed into a conductive material to form local wiring.

Semi-insulating (SI) semiconductor compounds, such as a binary compound of InP (indium phosphide), are used widely in radio frequency (RF) circuits as well as opto-electronics (e.g., in laser communication technologies). Indium phosphide is a semiconductor. To turn InP into a semi-insulating (SI) material, the material is doped with impurities such as iron (Fe) or chromium (Cr), which act as traps for free carriers. Of course, semi-insulating semiconductor compounds can be formed in other ways. For example gallium arsenide (GaAs) can be turned semi insulating when bombarded with protons. The semi-insulating (SI) semiconductor compound acts as an insulating structure in the sense that it is voided of free carriers.

Conventionally, interconnects are formed to connect individual devices located on a semi-insulating semiconductor substrate. These conventional interconnects are formed by adding a thick insulating layer over the entire wafer so as to cover the individual semiconductor devices. Holes, or vias, are then formed in the thick insulating layer down to the device terminals (for example the source, drain or gate of a field effect transistor). A metal layer is then formed so as to fill the vias and extend over the thick insulating layer from one individual device to another individual device through the vias so as to connect the individual devices.

The process of connecting the above devices using conventional interconnects adds significant cost to the final device and may limit device density.

SUMMARY OF THE INVENTION

In view of the foregoing, and other, exemplary problems, drawbacks, and disadvantages of the conventional systems, it is an exemplary feature of the present invention to provide a structure and method which allows the formation of interconnects on a semi-insulating semiconductor more efficiently.

A first aspect of the present invention, to achieve the above features and purposes described herein, is a semiconductor structure including a semi-insulating semiconductor layer, a plurality of isolated devices formed over the semi-insulating semiconductor layer, and a metal-semiconductor alloy region formed in the semi-insulating semiconductor layer. The metal-semiconductor alloy region electrically connects two or more of the isolated devices.

This may provide interconnects on a semi-insulating semiconductor.

A second aspect of the invention is directed to a method of forming a semiconductor structure. The method includes providing a semi-insulating semiconductor layer including a plurality of isolated devices formed thereon, and alloying a metal with the semi-insulating semiconductor layer so as to form a metal-semiconductor alloy region electrically connecting two of the isolated devices.

BRIEF DESCRIPTION OF THE DRAWINGS

The foregoing and other purposes, aspects and advantages will be better understood from the following detailed description of an exemplary embodiment of the invention with reference to the drawings, in which:

FIG. 4 illustrates an exemplary semi-insulating layer having isolated devices formed thereon;

FIG. 5 illustrates an exemplary embodiment of the claimed invention having a local interconnect formed so as to connect the individual devices;

FIG. 6 illustrates a top down view of the exemplary embodiment of FIG. 5;

DETAILED DESCRIPTION OF EXEMPLARY EMBODIMENTS OF THE INVENTION

Figure 1:
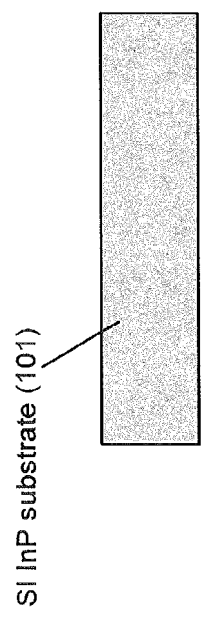
FIG. 1 illustrates an exemplary semi-insulating layer 101.
Figure 2:
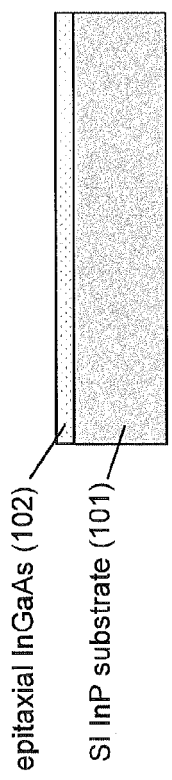
FIG. 2 illustrates an exemplary semi-insulating layer 101 with an active layer 102 formed thereon.
Figure 3:
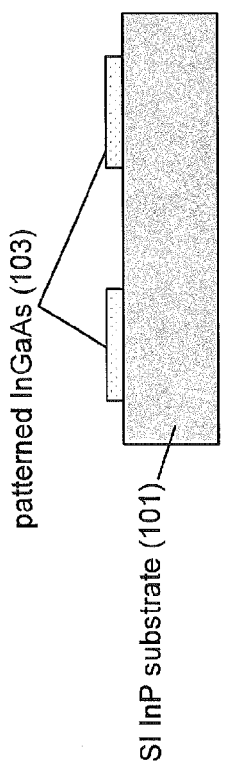
FIG. 3 illustrates an exemplary semi-insulating layer 101 with individual regions 103.

Referring now to the drawings, and more particularly to FIGS. 1-8, there are shown exemplary embodiments of methods and structures according to the present invention.

As noted above, the BOX in a SOI device is always an insulator and cannot be transformed into a conductive material to form local wiring. This is not the case when semi-insulating III-V substrates or layers are used.

A semi-insulating (SI) material, for example SI InP, can be made conductive by reacting the InP with a metal such as Ni or Co. Thus, it is possible to make a conductive wire in SI InP by a process where Ni is reacted with InP to form a Ni—InP alloy. The material adjacent to the Ni—InP wire remains SI InP and is therefore non-conductive. An exemplary embodiment of the invention includes forming of local interconnects between InGaAs devices by making Ni—InP wires in a SI InP.

Of course, the semi-insulating substrate can be made of other materials. For example, GaAs is turned into a semi insulating (SI) material when irradiated with protons. Alternatively, SI GaAs can be obtained by doping the material with chromium (Cr). Indeed, the invention is applicable to any suitable semi-insulating semiconductor and reactant which will produce a conductive material.

Figure 8:
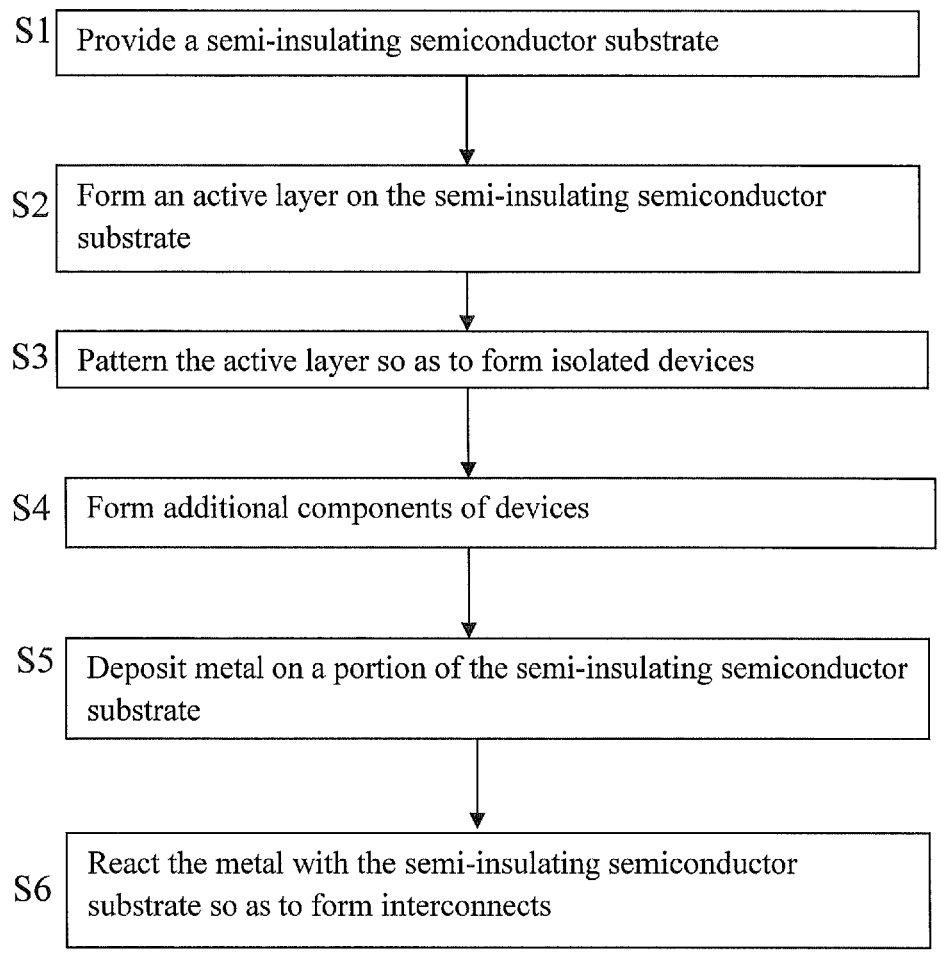
FIG. 8 illustrates a flow chart that summarizes the main process steps to form local interconnect over a semi insulating substrate.

FIGS. 1-4 illustrate the basic forming of individual devices on a substrate, FIG. 8 illustrates an exemplary method of performing the invention. Semi-insulating semiconductor layer 101 may be formed of InP or other suitable semi-insulating semiconductor materials (S1). Semi-insulating layer 101 can be the substrate and can provide mechanical support for further layers and/or allow additional layers to be formed thereon.

For instance, active layer 102 can be formed on semi-insulating layer 101 (S2). The chemical structure of active layer 102 is not particularly limited and may be formed of, for example, InGaAs epitaxially grown on the semi-insulating substrate 101. Active layer 102 can be formed by chemical vapor deposition (CVD), metal-organic chemical vapor deposition (MOCVD), Molecular beam epitaxy (MBE), metal-organic molecular beam epitaxy (MOMBE), etc. so as to form an epitaxial layer on semi-insulating substrate 101.

Active layer 102 can be patterned so that individual regions 103 may be electrically isolated from one another on the semi-insulating layer 101 (S3). The patterning may be done by any conventional method such as lithography or reactive ion etching (RIE). When the fabricated devices are field effect transistors (FET), the individual regions 103 typically include the device channel 108. This essentially forms what is known as an RX level.

A gate dielectric 105, gate lines 107, and spacers 106 adjacent to the gate lines 107, may be formed over channel 108 using any suitable method. On either side of channel 108, a source/drain region 104 may be added by epitaxial growth of a doped material or alternatively by ion implantation. This creates individual devices 200 which are electrically isolated from each other on the semi-insulating layer 101 (S4). While a planar FET is used in this example, the invention also can be applied to any other devices formed on a semi-insulating semiconductor. These devices include, FinFETs, bipolar transistors, and diodes.

Figure 7:
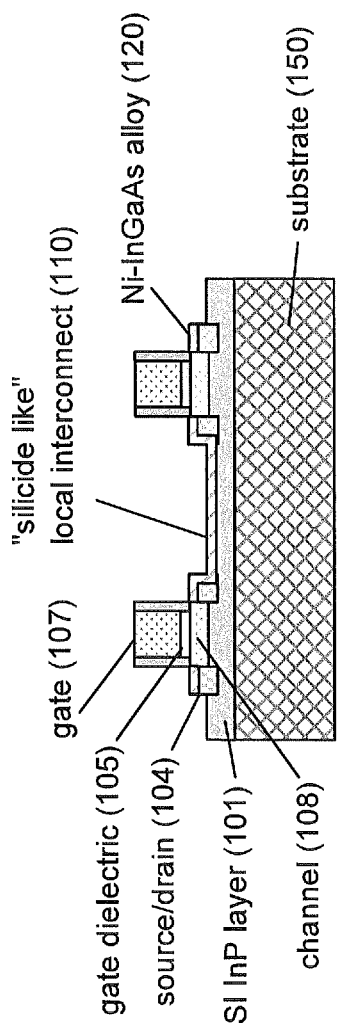
FIG. 7 illustrates an exemplary embodiment having a semi-insulating layer formed on a substrate.

As illustrated in FIGS. 5-7, an exemplary aspect of the invention includes forming a local interconnect 110 by forming a short conductive line to connect two individual devices 200 by depositing a metal such as nickel, cobalt, palladium, platinum, etc. and reacting the metal with the semi-insulating layer 101. The portion of the semi-insulating layer 101 which reacts with the metal becomes conductive so as to form local interconnect 110. For example, the local interconnect 110 may be formed of Ni—InP alloy as a result of reacting Ni with a semi-insulating substrate formed of InP. Optionally, only a top portion of the semi-insulating layer 101 is converted to the Ni—InP alloy to form local interconnect 110. The amount of semi-insulating InP that is converted to a metal-InP alloy is controlled by the thickness of the metal (e.g., nickel) and the annealing temperature that is used to react the metal with the SI InP. While it is rational that a thicker metal deposition would typically result in forming a thicker metal-InP alloy, the reaction temperature role in forming a metal-InP alloy needs more discussion.

The reaction temperature can control the formation of the metal-InP phase. Formation of the $Ni_2InP$ phase and segregation into NiIn and NiP binary phases is possible. A detailed discussion of the various phase forming in the Ni—InP system is given in S. E. Mohney and Y. A. Chang, "Phase formation in Ni/InP contacts", J. Appl. Phys. 78, 1342 (1995), incorporated here by reference in its entirety. The Ni—InP phases vary in their crystallographic structure and in their Ni to InP atomic ratio. As a result, the thickness of the resulting Ni—InP alloy would depend on the phase that was formed. While nickel was provided in the above example, other metals such as Co, Pd, Pt, Ti and alloys thereof can be used to form a metal-InP alloy.

To form interconnect 110, metal is disposed on the semi-insulating layer 101 (S5). In an exemplary aspect of the invention, the metal is disposed on a portion of the semi-insulating substrate by masking techniques or selective deposition techniques. For example, a lift-off method which uses photoresist with a negative slope sidewall profile can be used to define metal lines where the resist is open. In this technique the wafer is first coated with a photoresist. The photoresist is then exposed through an optical mask or by an electron beam and developed to obtain a patterned resist that mimics the optical mask pattern. A blanket metal is then evaporated, or deposited using a line-of-sight method. The resist is then dissolved using a solvent. Only those regions that were not covered by a resist would maintain the deposited metal.

Alternatively, the metal can be disposed over an entire portion of the semi-insulating layer 101 and then portions of the metal removed so as to form the desired pattern for the local interconnect. The removal of the metal is typically done by lithography and RIE. Following the metal deposition, the wafer is first coated with a photoresist. The photoresist is patterned by exposure to light through a mask or by an electron beam. Reactive ion etching (RIE) is then used to etch the metal in regions not covered (protected) by resist. The resist is then removed by a solvent or by oxygen plasma. Only those regions that were covered by the resist will be covered with metal.

Optionally, the metal can also be deposited on the source/drain 104 or a portion thereof so form a metal alloy such as Ni—InGaAs after reacting. In particular a self-aligned process where the metal is blanket deposited over the individual devices 200 can be used to form the metal-semiconductor alloy over the source/drain 104 regions. The metal does not react with the gate line 107 which is typically encapsulated by the sidewalls spacers 106. Since the metal-semiconductor alloy that forms over the exposed source/drain 104 regions is self-aligned with the gate spacers 106, access resistance to the device is minimized.

Once the metal is disposed in the appropriate pattern, the metal can then be reacted with the semi-insulating substrate by an annealing process (S6) so as to form a metal-semiconductor alloy region (e.g., a Ni—InP alloy) where the metal was disposed on the semi-insulating substrate, and optionally a metal-semiconductor alloy (e.g., a Ni—InGaAs alloy) where the metal was disposed on the source/drain 104. The reaction of the metal is with the semi-insulating layer and optionally the active semiconductor layer is obtained by annealing. The annealing process is typically done in a rapid thermal annealing (RTA) chamber where the wafer is rapidly heated to a specified temperature and then rapidly cooled down. Typical annealing temperatures depend on the semi-insulating substrate. For SI InP, the annealing temperature would be in the range of 200° C. to 500° C. and more typically at about 250° C. to 400° C. During the annealing, the chamber ambient is typically nitrogen ($N_2$). However, for temperatures in excess of about 400° C. a group-V containing gas is used to preserve the semiconductor surface. For example, when annealing of InP, a phosphine ($PH_3$) or arsine ($AsH_3$) is typically used. In an exemplary embodiment of the claimed invention, it is possible to have a portion of the top layer of the semi-insulating layer 101 converted to the metal-semiconductor alloy such that a portion of the local interconnect 110 is embedded within the semi-insulating semiconductor layer 101.

While semi-insulating layer 101 may be used as the substrate, in another aspect of the invention the semi-insulating layer 101 (e.g., InP) is formed on a substrate 150, as illustrated in exemplary FIG. 7. Substrate 150 can be a semiconductor which is not a semi-insulating semiconductor. For instance, substrate 150 may be formed of intrinsic InP or n-type doped InP or p-type doped InP. Substrate 150 can also be made of a material different than InP such as GaAs, InAs, Ge or Si. When substrate 150 is made of a different material than the semi-insulating layer 101, additional engineering is required to resolve issues such as lattice mismatch and anti-phase boundaries that are common in hetero-material integration. Solutions related to hetero-material integration were extensively discussed in the literature and are not the scope of this invention. Regardless, the technique disclosed herein is applicable to material 101 being a substrate or a thin layer that was formed on a handle substrate 150. The invention therefore allows the forming of local interconnects on semi-insulating semiconductors to be applied to substrates which are not made of semi-insulating semiconductors.

While the invention has been described in terms of exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

The invention claimed is:

1. A semiconductor structure, comprising:
    a semi-insulating semiconductor layer;
    a plurality of isolated devices formed over the semi-insulating semiconductor layer; and
    a metal-semiconductor alloy region formed in the semi-insulating semiconductor layer,
    wherein the metal-semiconductor alloy region electrically connects two or more of the isolated devices, and
    wherein the metal-semiconductor alloy region comprises one of Ni, Co, Pd, Pt, Ti and alloys thereof alloyed with InP.

2. The semiconductor structure of claim 1, wherein one or more of the isolated devices comprises a field effect transistor (FET).

3. The semiconductor structure of claim 2, wherein the field effect transistor includes channel regions of InGaAs.

4. The semiconductor structure of claim 1, wherein the metal-semiconductor alloy region is embedded in the semi-insulating semiconductor layer.

5. The semiconductor structure of claim 1, wherein the semi-insulating semiconductor layer comprises iron doped InP.

6. A semiconductor structure, comprising:
    a semi-insulating semiconductor layer;
    a plurality of isolated devices formed over the semi-insulating semiconductor layer;
    a metal-semiconductor alloy region formed in the semi-insulating semiconductor layer, wherein the metal-semiconductor alloy region electrically connects two or more of the isolated devices; and
    a semiconductor layer on which the semi-insulating semiconductor layer is disposed.

7. The semiconductor structure of claim 6, wherein the semiconductor layer comprises a material different than a material of the semi-insulating semiconductor layer.

8. The semiconductor structure of claim 2, wherein the FET includes at least one of a source and a drain.

9. The semiconductor structure of claim 8, wherein the source and the drain comprise a III-V compound, and
    wherein at least one of the source and the drain comprises a metal alloy region formed in the III-V compound.

10. The semiconductor structure of claim 1, wherein the semi-insulating semiconductor layer comprises irradiated InP or GaAs.

11. A method of forming a semiconductor structure, the method comprising:
    providing a semi-insulating semiconductor layer including a plurality of isolated devices fixated thereon; and
    alloying a metal with a portion of the semi-insulating semiconductor layer so as to form a metal-semiconductor alloy region electrically connecting at least two of the isolated devices,
    wherein the semi-insulating semiconductor layer comprises one of iron-doped and chromium-doped InP.

12. The method according to claim 11, wherein the alloying the metal with the portion of the semi-insulating semiconductor layer comprises:
    disposing the metal on the portion of the semi-insulating semiconductor layer so as to form a pattern; and
    annealing the metal on the semi-insulating semiconductor layer so as to form the metal-semiconductor alloy region.

13. The method according to claim 12, wherein the disposing the metal on the portion of the semi-insulating semiconductor layer comprises:
    applying a mask on the semi-insulating semiconductor layer; and
    applying the metal so as to cover a portion of the semi-insulating semiconductor layer not covered by the mask.

14. The method according to claim 11, wherein the metal-semiconductor alloy region comprises Ni alloyed with InP.

15. The method according to claim 11, further comprising disposing the semi-insulating semiconductor layer on a semiconductor substrate,
    wherein the semiconductor substrate comprises a material different than a material of the semi-insulating semiconductor layer.

16. The method according to claim 11, further comprising alloying the metal with a portion of an isolated device of the plurality of isolated devices.

17. The method according to claim 11, wherein an isolated device of the plurality of isolated devices comprises at least one of a source and a drain.

18. The method according to claim 17, wherein the at least one of the source and the drain comprises a III-V compound.

* * * * *